United States Patent [19]
Balyoz et al.

[11] 4,080,720
[45] Mar. 28, 1978

[54] HIGH DENSITY SEMICONDUCTOR CIRCUIT LAYOUT

[75] Inventors: John Balyoz, Hopewell Junction; Algirdas Joseph Gruodis, Wappingers Falls; Teh-Sen Jen, Fishkill; Wadie Faltas Mikhail, Poughkeepsie, all of N.Y.

[73] Assignee: International Business Machines Corporation, Armonk, N.Y.

[21] Appl. No.: 754,704

[22] Filed: Dec. 27, 1976

Related U.S. Application Data

[62] Division of Ser. No. 644,775, Dec. 29, 1975, Pat. No. 4,032,962.

[51] Int. Cl.² ............................................. H01L 29/72
[52] U.S. Cl. .................................................... 29/577 C
[58] Field of Search ............................. 29/577, 576 R

[56] References Cited
U.S. PATENT DOCUMENTS 3,902,188   8/1975   Jacobson ................................ 357/68

*Primary Examiner*—Gerald A. Dost
*Attorney, Agent, or Firm*—Thomas F. Galvin

[57] ABSTRACT

An integrated logic circuit having a novel layout in a semiconductor substrate. The area required for the circuits within the substrate is substantially less than that of prior layouts. Each circuit includes a first device including an elongated impurity region and a set of other impurity regions either in, or in contiguous relationship with, the elongated region; to form a set of diode junctions. The elongated region is capable of containing a predetermined maximum number of the other impurity regions. A second device is located adjacent the narrow side of said first device. A first set of first level conductors extends over the elongated region orthogonally with respect to the elongated direction and are interconnected to selected ones of the other impurity regions. Another conductor is a second level atop the substrate is connected to an impurity region of the second device and extends substantially parallel to the elongated direction. For the most part, this conductor connects the second device with one of the conductors in the first set. The reference potential connections to each circuit are also made preferably by conductive channels running in the same direction. With respect to chip architecture, each logic circuit is of substantially identical identical geometric form and arranged in columnar arrays.

17 Claims, 9 Drawing Figures

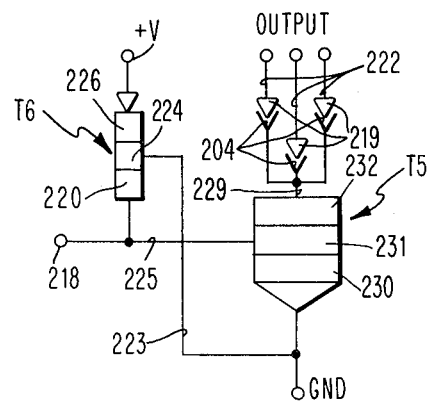
FIG. 6
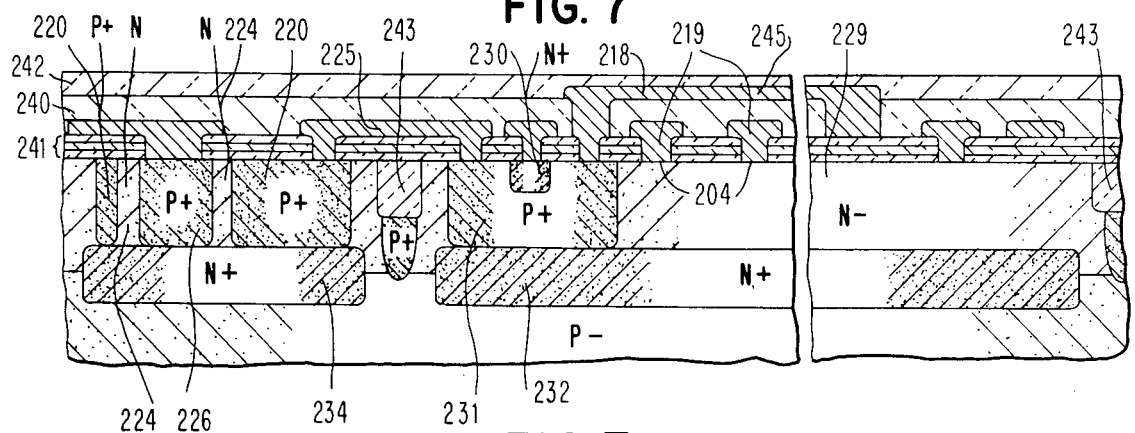
FIG. 7
FIG. 7A

HIGH DENSITY SEMICONDUCTOR CIRCUIT LAYOUT

This is a division of application Ser. No. 644,775, filed Dec. 29, 1975, now U.S. Pat. No. 4,032,962.

CROSS-REFERENCE TO A RELATED APPLICATION

This application is related to copending application Ser. No. 589,231, in the names of Eichelberger et al entitled "High Density Architecture for a Semiconductor Chip", filed June 23, 1975, and assigned to the same assignee as the present application.

BACKGROUND OF THE INVENTION

1. Field of the Invention

This invention relates to semiconductor integrated circuits and more particularly to monolithic integrated circuits of the bipolar logic families.

2. Description of the Prior Art

In designing the architecture of circuitry on a semiconductor chip, the critical factors of power dissipation circuit type, physical layout and performance must be compromised to achieve low cost. Recently, the physical layout or architecture of the chip has begun to receive increased consideration. Once a circuit family, such as Transistor-Transistor Logic (TTL), Diode-Transistor Logic (DTL), Merged Transistor Logic (MTL), etc. has been chosen, the power dissipation is more or less fixed. The performance of the design, consisting of intracell and intercell delays, is also fixed both by the circuit family as well as the physical layout. Thus, the physical layout is the remaining factor over which the semiconductor structure or circuit designer has some control.

TTL circuits enjoy widespread use in logic chips. This family offers high performance in terms of switching speed while not requiring inordinate amounts of power. They are capable of a broad range of logic functions, are relatively insusceptible to AC noise and have good fan-in and fan-out capabilities. The circuit design limitations of the TTL circuits are relatively well understood and the fabrication of such circuits in semiconductor integrated circuit form offers few problems at the present state of the art. Work has continued on reducing the cost and improving the performance of the TTL circuit by attempting to increase the packing density of the circuits within a given chip area. The same can be said for DTL and the relatively recent MTL ($I^2L$) circuit families.

One such example of chip architecture, or layout, which utilizes bipolar circuits is described in the application by E. A. Cass, Ser. No. 483,463, filed June 26, 1974, and assigned to the same assignee as the present application. In that layout, the cells are arranged in an orthogonal array, with the cells in substantially parallel rows in both orthogonal directions. In the preferred embodiment of the Cass invention, the cells are arranged in blocks which are two cells wide in the Y direction and four cells wide in the X direction. Each cell takes up substantially the same amount of chip area and has substantially the same layout configuration as every other cell. The chip layout features a regularly-structured matrix of logic gates exhibitng a nearly equal preference for data flow progression in both horizontal and vertical directions.

The Cass invention has been successful in reducing both the number of required metallization levels for intra and intercell connections as well as the size of the cells as compared to prior art layouts. In addition, the "personalization" of the chip, i.e., the placement of the metallization wiring to define a specific circuit interconnection structure by computerized design automation, is substantially easier with the Cass layout than with previous designs. However, a significant amount of chip area is unused for active devices because of the space required by the metallized wiring on the surface of the chip.

SUMMARY OF THE INVENTION

The primary object of our invention is to increase the circuit density of logic cells in a semiconductor chip.

It is yet another object to interconnect the increased number of cells without requiring an increase in the area used for metallized wiring.

It is a more specific object of our invention to provide a compact chip layout for various circuit families.

It is a further object to provide a method using standard integrated circuit techniques for fabricating the chip layout.

These and other objects are achieved by providing a columnar array of substantially identical circuits on a substrate. Each circuit includes a first device including an elongated impurity region and a set of other impurity regions disposed continguous to or in it to form diode junctions. The elongated region is capable of containing a predetermined maximum number of the other regions. A second device is located adjacent the narrow side of said first device. A first set of first level conductors extends over the elongated region orthogonally with respect to the elongated direction and are interconnected to selected ones of the other impurity regions. The number of said other impurity regions which are actually so interconnected is always less than said predetermined number. Another conductor in a second level atop the substrate is connected to an impurity region of the second device and extends substantially parallel to the elongated direction. For the most part, this other conductor connects the second device with one of the conductors in the first set. It is then interconnected to another circuit in the same column. Alternatively, the other conductor may be connected to another circuit in a different column or off-substrate.

One of the three preferred embodiments described hereafter is TTL circuit in which the first device is a multi-emitter transistor having an elongated base region. The emitters comprise the other regions interconnected to the first set of conductors for receiving input signals. The second device is the output transistor, the collector of which is connected to the other conductor for providing output signals from the TTL circuit either to other circuits on the substrate or off-substrate.

Embodiments of DTL and MTL ($I^2L$) circuits are also described.

Other features include reference-potential-supplying conductors extending orthogonally with respect to the elongated direction.

For the TTL and DTL layouts, resistors elongated substantially in the same direction as the elongated region are formed for interconnecting the transistors and the reference-potential-supplying conductors.

BRIEF DESCRIPTION OF THE DRAWING

FIG. 6 illustrates an MTL logic circuit featuring Schottky barrier clamping diodes associated with the MTL circuit.

FIGS. 7 and 7A all plan and cross-sectional views, respectively, of the semiconductor layout of the circuit in FIG. 6.

DESCRIPTION OF THE PREFERRED EMBODIMENTS

Figure 1:
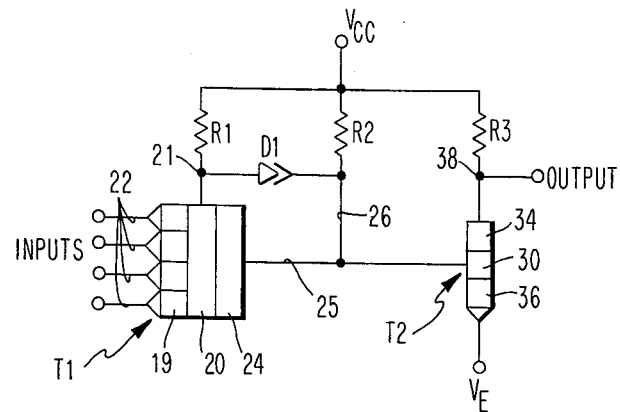
FIG. 1 illustrates a prior art TTL circuit which performs the NAND logic function.
Figure 2:
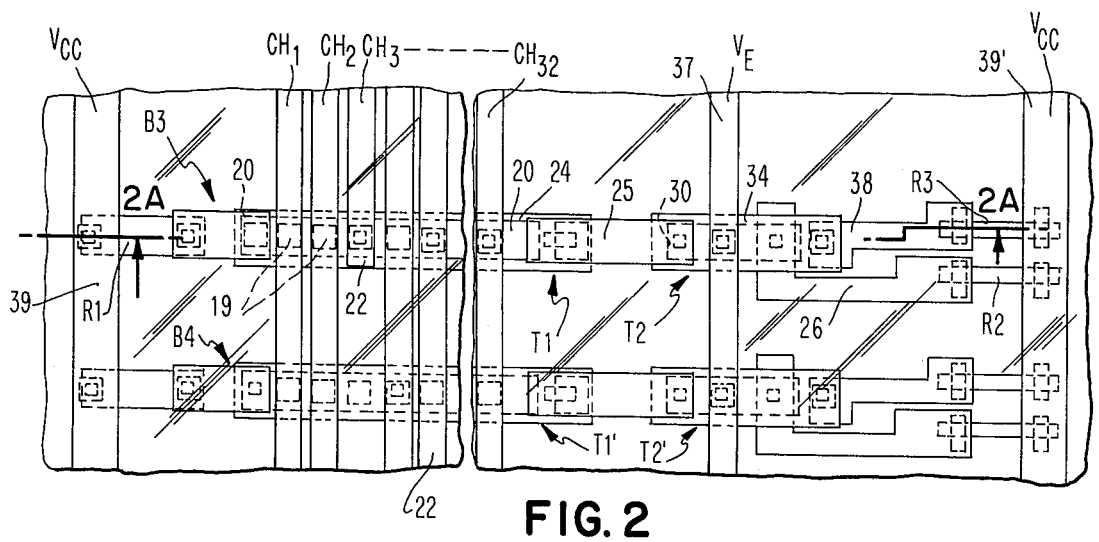
FIGS. 2 and 2A are plan and cross-sectional views, respectively, of a pair of cells in semiconductor form of the TTL circuit shown in FIG. 1.
Figure 2A:
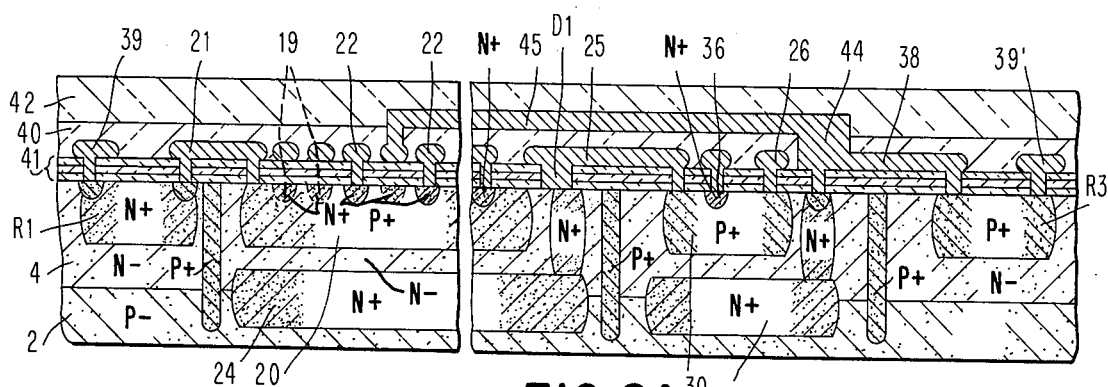

Turning now to the drawings, the prior art TTL circuit in FIG. 1 performs the NAND function, which provides a positive or "up" level output for all input combinations except for the combination where all inputs are positive. Input transistor T1 is a multi-emitter device coupled at its collector output 24 to the base of a single-emitter transistor T2. Resistors R1, R2, and R3 provide appropriate biasing to transistors T1 and T2. Diode D1 is an optional device which clamps transistor T1 to reduce its inverse Beta. If required by the circuit design, the base-to-collector junction of transistor T2 could also be clamped by a Sohottky Barrier diode. As previously noted, the circuit in FIG. 1 is well known to those of skill in the art and forms no part of our invention in itself. FIGS. 2 and 2A are plan and cross-sectional views, respectively, of a pair of cells, denoted B3 and B4, which are formed in accordance with our invention. The upper cell comprises transistors T1 and T2; the lower cell comprises transistors T1' and T2'. In FIG. 2, the second level of metallization is omitted to simplify analysis of the various regions of the substrate and the first level of metallization. However, the second level is illustrated in FIG. 2A. Each cell is a TTL circuit of the type shown in FIG. 1 which comprises a plurality of impurity regions of different conductivity types extending into the chip to provide transistors and resistors. These regions are interconnected via a first metallization to form the TTl circuit. As connected in FIG. 2, each cell corresponds to the TTL circuit shown in circuit form in FIG. 1. The numerals in FIGS. 2 and 2A correspond to those in FIG. 1.

Transistor T1 comprises an elongated subcollector region 24, an elongated base region 20 and a plurality of emitter regions 19 in the elongated base region. The emitter regions are selectively connected through insulator 41 to a metallization layer, which includes a set of channel paths for conductive lines denoted CH1, CH2,...CH32. The metallization is insulated by dielectric layers 40 and 41. As illustrated the channels run orthogonally with respect to the elongated direction of the elongated base region 20. This is significant, indeed critical, for increased circuit density.

Thus, base region 20 is an elongated impurity region containing a set of other regions, i.e., emitters 19 to form diode junctions. As illustrated in FIG. 2A, only those emitters which are actually connected to first level conductors are formed within base 20. The other areas within the base which could contain emitter regions are denoted by phantom lines.

In practice, the integrated circuit designer has at least two alternatives in his choice of personallization. If desired, all of the predetermined maximum number of emitters, in this case 32, could be formed within base region 20. One step in the chip personallization process would then be accomplished at the first level of metallization — only those emitters chosen by the wiring plan would be interconnected through isolation 41 to conductive lines 22.

Alternatively, the personallization step may be accomplished by forming only those emitter regions within base region 20 which are to be used. Each of these emitter regions, amounting to four in the preferred embodiment, would be interconnected to lines 22. The choice depends on the mechanics of the wiring method, automated or manual, in the use by the designer.

The important point from the standpoint of our invention is that the number of impurity regions (emitters) actually interconnected to conductive lines 22 is less than the maximum number of emitters which could be so connected. In the preferred embodiment, only four of the emitters 19 are so interconnected our of a possible 32. This is the case whether or not all or a portion of the emitters are actually formed in the elongated base region. This leaves numerous other conductive lines 22 free to be connected to emitters of other transistors. As will be clear to those of skill in the semiconductor art, the number of channels to be provided in a column is merely a matter of design choice.

Returning to FIG. 2, there are preferably 32 conductive line paths denoted CH1, CH2,...CH32; four of these channels may contain conductive lines, or stripes, which are connected to four emitters of transistor T1. The remaining lines in the paths are disposed over emitter regions 19 but are not connected to the emitters in the cell illustrated. Thus, there are 32 selectable emitter regions for input signals; but only four of these regions in this embodiment actually serve as input signal terminals.

Although each path is illustrated as containing a conductive line, this is not usually the case. For specific circuit networks, it is normally appropriate to omit depositing conductive lines except where they are required. Channels not used for T1 in circuit B3, may and usually will, be connected to the emitters of transistor T1' in circuit B4 or the emitters of transistors in other cells (not shown). In some designs, the same conductive line in a particular path will be connected to an emitter region of more than one cell. In other cases, a path may contain more than one conductor by forming an electrical discontinuity in the path. In this way, emitter regions in the different cells lying under the same path may serve as isolated inputs to their respective circuits.

Conductors 37, 39, and 39' supply reference potentials to each circuit and are also disposed orthogonally with respect to the elongated direction.

Base 20 of T1 is connected to conductor 39 which supplies reference potential, $V_{CC}$, via metallization 21 and resistor R1. Transistor T2 is to the right of T1 in FIGS. 2 and 2A and comprises subcollector 34, base 30 and a single emitter 36. Emitter 36 is connected to reference potential $V_{BB}$ which is supplied by conductive line 37. Base 30 of T2 is connected to the collector 24 of T1 by conductive line 25.

Resistors R1, R2, and R3 are formed in a standard manner within epitaxial layer 4 either by diffusion of N+ or P+ conductivity dopants, by ion implantation of the dopants or both. Resistor R1 is connected to reference potential $V_{CC}$ by first level conductor 39 which runs parallel to the emitter input channels. Potential $V_{CC}$ is also connected to resistors R2 and R3 via conductive channel 39'. Resistor R2 is connected to base 30 of T2 by first level conductor 26 also to the collector of T1 through base region 30 and first level conductor 25. Resistor R3 is connected to collector 34 of T2 by first level conductor 38.

Cells B3 and B4 may be segregated electrically from one another by conventional methods such as dielectric isolation or junction isolation.

The output of NAND gate 16 is taken from collector 34 by a via connection 44 to a second level of metallization 45 which runs parallel to the elongated direction. The second level of metallization is insulated from the first level by dielectric material 40. As illustrated in FIG. 2, the collector output of cell B3 is connected to one of the emitter channels 22 by metallization 45. This channel is connected to an emitter of one of the other cells in chip 10. Alternatively, the collector output of cell B3 may be connected to an input of another cell in a different column of the chip in the same fashion; or it may be connected to a driver circuit at the periphery of the array or even off-substrate.

The crossing of the collector output of the circuit within a second level of metallization over the first level of metallization containing the channel inputs is significant in providing a very dense circuit count on the chip. In fact, it is critical. It might be supposed that a diffused region within the semiconductor substrate would suffice instead of a second level of metallization. However, this is not the case.

If a diffused or implanted region were used as a conductive path, e.g., a highly doped N+ diffusion within the epitaxial region 4, the path would exhibit a high distributed resistance and capacitance. The metallization path 45, on the other hand, has a much lower impedance. Typically, an N+ region would exhibit a resistance of 5 ohms per square and a capacitance of 0.08 pf per mil$^2$ as compared to a metal conductor of at most 0.04 ohms per square and a worst case capacitance of 0.025 pf per mil$^2$ at most.

In a typical semiconductor chip of 180 by 180 square mils, the length of a resistive path would vary from around 20 mils to 160 mils. The resistive region would present a resistive load of as much as 8,000 ohms and a capacitive load if as much as 12.8 pf. If the collector output of a typical TTL circuit such as is shown in FIG. 2 were connected to this load in addition to the normal load of circuit, the noise margin of the circuit would be reduced substantially, if not eliminated completely, and the RC time delay of the circuit would be excessive.

Moreover, any attempt to reduce the series resistance of the resistive path within the substrate such as by increasing the width of the region would increase both the size of the circuit as well as the capacitance. Thus, it is necessary that a conductive metallic line be used.

Fabrication Process

In the fabrication of the circuit illustrated in FIGS. 2 and 2A, the process of forming the N type subcollector regions 24, the P+ isolation regions and epitaxial regions 4 is preferably the standards used in the industry. The P+ base regions 20 and 30 are preferably formed by a boron diffusion simultaneously as previously noted. Base region 20 is elongated in the direction transverse with respect to the conductive channels. In practice, for a device with 32 possible conductive channels disposed in the first level of metallization, the length of the base region 20 is around 16 mils while its width is around 0.5 mils, a length-to-width ratio of around 32:1.

Base region 30 is also somewhat elongated, this length being around 1.25 mils, with the same width as that of base region 20. The entire circuit B3 is 20.25 × 0.925 mils.

The emitter regions 19 of the transistors are formed in spaced relationship within the base regions. The emitters in the preferred embodiment comprise thermally diffused arsenic although thermally diffused phosphorus, or ion implanted arsenic or phosphorus, or a combination of diffused and ion implanted materials may be used. As illustrated in FIG. 2A, the emitter regions 19 not contacted by a via connection to conductive channels 22 are shown in phantom lines. This indicates that the emitters in the preferred embodiment are not formed within base region 20 unless they are to be used as an input connection through the conductive channels. Alternatively, all of the emitter regions, in the present embodiment, 32, may be formed simultaneously, irrespective of the fact that only four of the regions will actually be used in any given device.

As previously discussed, the choice of whether or not to form all of the emitter regions depends on the particular step in the fabrication process at which "personalization" begins. If a given chip is personalized beginning at the first level of metallization, then it doesn't matter whether all of the emitter regions are formed or only those which are to be used. If, however, it is desired to begin "personalization" at the time of emitter formation, then clearly only those emitters which are to be used are actually formed.

Contacts to the emitter regions as well as to the other regions shown in FIG. 2A are made through the composite insulation layer 41 which comprises a first layer of silicon dioxide, a layer of silicon nitride and a layer of pyrolytically-deposited silicon dioxide. As will be understood by those of skill in the art, other dielectric layers could be substituted for composite layer 41 with good results.

The first level of metallization for forming both the ohmic contacts to the impurity regions as well as the non-ohmic contacts to the Schottky Barrier diodes comprises a first layer of chrome at around 0.1 micron thickness, a layer of platinum deposited thereon, followed by an alloy of aluminum, copper, and silicon which is the principal metallization used. Other types of metallization may also be used.

After the first layer of metallization has been formed, a layer of insulative material such as quartz is deposited to provide insulating between the second level of metallization to be formed and the first level of metallization. The quartz layer, 40, is preferably formed by a planarization process such as that described in the patent application of Auyang et al entitled "Process for Planarizing a Substrate", Ser. No. 512,781, filed Oct. 7, 1974, and assigned to the same assignee as the present application.

The third personalization step in the formation of the circuit comprises forming via holes in glass layer 40 where connections are to be made from the second level of metallization to the first level. In FIG. 2A, a connection is made from the collector of transistor T2 via metallization 44 to one of the conductive channels, CH4 in this case, which is not used as an emitter connection to transistor T1 of the same circuit. In the usual case, the output of the collector of one circuit will also comprise one of the emitter inputs of another circuit, the connection being made by one of the conductive channels. The fact that this connection at the second level of metallization runs orthogonally with respect to the channels at the first level of metallization is a necessary factor in insuring a high density array.

After the completion of the second level of metallization, a glass layer 42 is then deposited, preferably in using the same technique as was used for layer 40. A subsequent level of metallization, not shown in the drawings for clarity and ease of illustration, is also formed in a standard manner to complete the metallization process.

Figure 3:
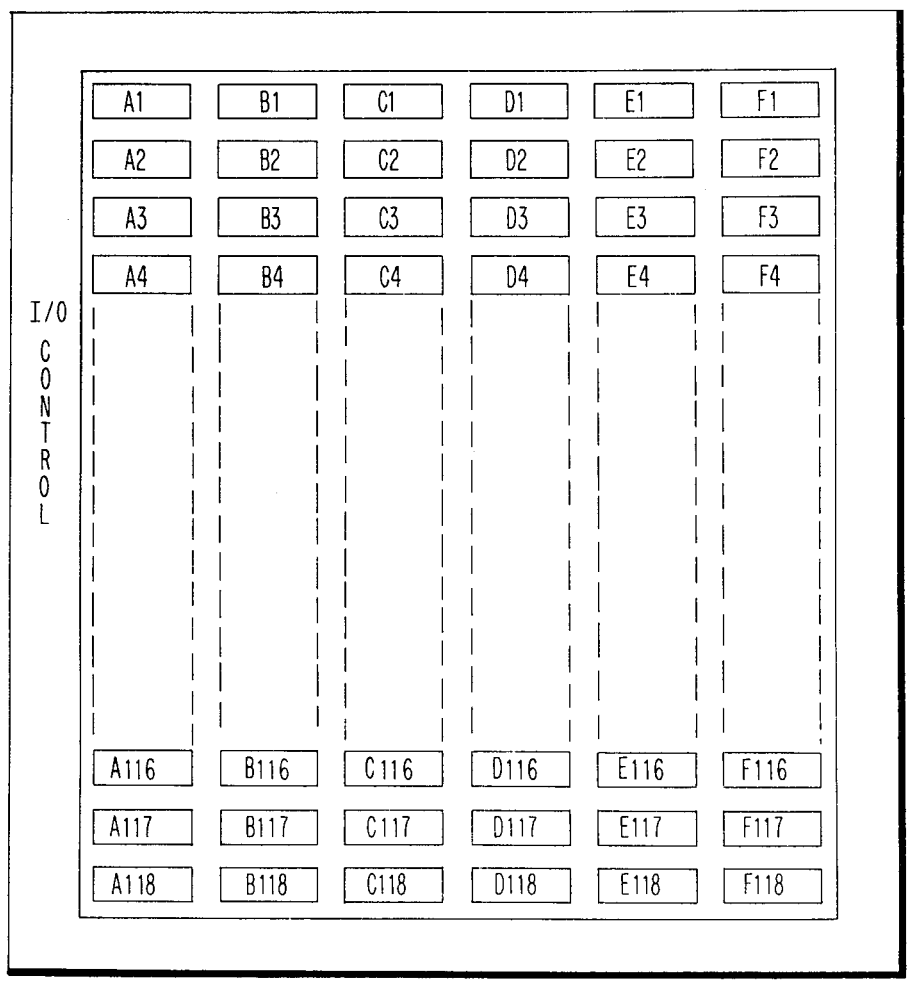
FIG. 3 illustrates the overall layout of the circuit shown in FIG. 2 on a semiconductor chip.

FIG. 3 illustrates the overall layout of the circuits shown in FIG. 2 on a semiconductor chip. Each cell: A1, A2..., B3, B4..., F117, F118, represents a single circuit illustrated in greater detail in FIG. 2. As illustrated in FIG. 3 the periphery of chip 10 is reserved for control circuits, receivers and drivers, which are common in the art and form no part in our invention. In a practical embodiment, the chip is 185 mils square with the area encompassed by the TTL circuits being around 162 mils square. As previously discussed, each cell is 20.25 mils by 0.925 mils wide. This allows an array of six columns and 118 rows for a total of 708 TT1 circuits. It will be appreciated by those skilled in the semiconductor circuit design art that this is an extremely dense layout for a bipolar circuit family. In fact, we know of no other circuit design which is commercially available which provides for such density.

The number of devices allowed on a given semiconductor will, of course, vary depending on the power requirements of the circuit, the type of cooling used for the system, among other factors. The figures related heretofore apply to an actual design of a chip layout which is well within the present state of the semiconductor processing art. The figures can be increased or reduced depending on numerous factors and it is not our intention to limit the scope of our invention by reciting these specific numbers. Rather, they are given to allow those of skill in the semiconductor art to fully appreciate the advantages which can be obtained by our design.

Figure 4:
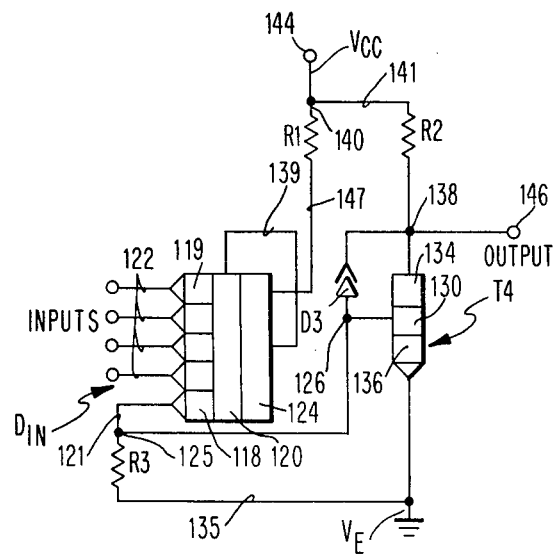
FIG. 4 illustrates a DTL type circuit which performs the NAND logic function.
Figure 5:
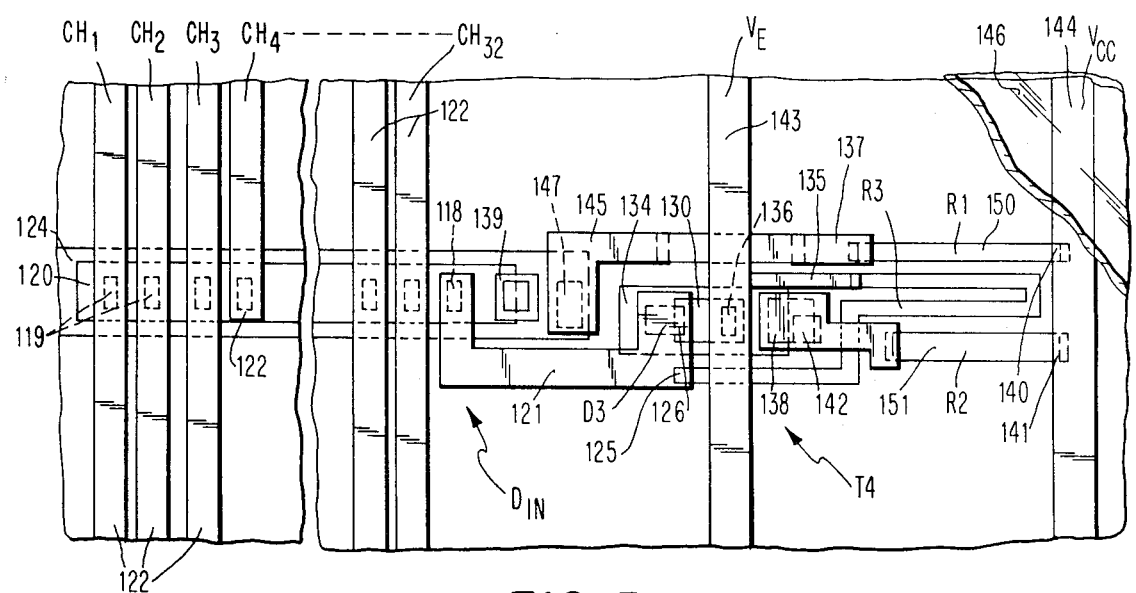
FIG. 5 illustrates a plan view of the semiconductor layout of the circuit in FIG. 4.

Turning now to FIGS. 4 and 5, there is shown a bipolar logic circuit, commonly known as a DTL circuit, which also performs the NAND logic function. The DTL circuit illustrated in FIG. 4 does not correspond to the standard DTL NAND circuit which is well known to circuit designers. In the standard circuit, the output of the multi-input diode is taken from the anode of the diode to the base of the output transistor. Our invention also contemplates the configuration of this standard DTL circuit; FIG. 4, however, is an improved DTL circuit in which the output is taken from an added cathode of the multi-input diode to the base of the output transistor. In addition, a pulldown resistor R3, in FIG. 4 is added between the emitter of the output transistor and the output cathode region 118 of $D_{IN}$. The circuit illustrated in FIG. 4 forms no part of our invention, which resides instead in the layout of the circuit shown in FIG. 5. However, it is preferred over the standard DTL circuit and is therefore described in this application for the purposes of describing the best mode of our invention.

As shown in FIG. 4, the circuit comprises a multi-input diode, denoted $D_{IN}$, and an output transistor T4. Schottky Barrier diode D3 is provided to increase switching speed. The various regions of the devices and the interconnections are enumerated for ease of understanding our invention when it is discussed with respect to FIG. 5. In operation as a logic gate, all of the inputs 119 must be at an "up" or "1" level before cathode (emitter) 118 will conduct. Transistor T4 then turns on due to the base current provided from cathode 118. This lowers the output level at 142 to ground ("0").

FIG. 5 illustrates a plan view of the layout according to our invention of the circuit in FIG. 4. The layout is quite similar to the TTL circuit illustrated in FIG. 2 and a cross-sectional view of the circuit is deemed unnecessary. Multi-input diode $D_{IN}$ comprises elongated regions 120 and 124 which correspond to the base and collector regions of a transistor. However, they are shorted together by connection 139 so as to form the anode of the multi-input diode, $D_{IN}$. Thus, region 120 is an elongated impurity region containing a set of other impurity regions 119 which corresponds to the emitters of a transistor, but are more properly termed the cathodes of a diode.

Diode regions 119 are selectively connected through an appropriate first insulation layer 146 to a metallization layer which includes a set of channel paths for conductive lines denoted CH1, CH2, ... CH32. As with all embodiments of our invention, the channels run orthogonally with respect to the elongated direction of the elongated region 120. As previously noted, this is critical for increased circuit density. Also in common with other embodiments of the invention: although there are a maximum predetermined number of cathode regions 119, say 32, only a limited number, in this case four, are actually used for any given circuit. This is the case whether or not all or a portion of the cathode regions 119 are actually formed in the elongated anode regions 120. This leaves numerous conductive lines free to be connected to the cathode regions of other multi-input diodes.

Conductors 143 and 144 supply reference potentials $V_E$ and $V_{CC}$ respectively, to the circuit. Only a single bus for supplying $V_{CC}$ is required, rather than the two buses illustrated with respect to the TTL circuit in FIG. 2. This is a benefit which is offset somewhat by the fact that resistor R1 which connects bus 144 to collector 124 must traverse a relatively long distance. The ability to achieve this design depends on the particular value of resistance of R1 which is required by the circuit design. In the present case, R1 is approximately 7 kilohms, which necessitates a long resistive path.

Continuing with a description of the circuit in FIG. 5 in relation to FIG. 4, output cathode 118 of $D_{IN}$ is connected via metallization 121 to resistor R3 at terminal 125, to the anode of Schottky Barrier diode D3 and base region 130 of transistor T4 at region 126. Schottky diode D3 is formed at the intersection of the metallic line 121 and the N− region of T4 which overlies the N+ subcollector 134.

Resistor R3 within the semiconductor substrate is generally U-shaped because its resistance is relatively high, around 18 kilohms. As with resistors R2 and R1, resistor R3 is elongated in the direction of the elongated direction of region 120. Resistor R3 is connected to potential $V_E$ by metallization 135 which is at the first level of metallization on insulating layer 146 and is connected by contact 125 to conductive line 121.

Resistors R1 and R2 are connected through insulating layer 146 to potential $V_{CC}$ at contacts 140 and 141, respectively. Due to the requirements of the value of resistance, resistor R1 is sectioned into two parts within the substrate which are interconnected by a first level conductive line 137. The resistor lies within the substrate when it passes under conductive line 143 and surfaces as a conductive line 145 before making contact with collector 124. Resistor R2 is connected to the output of the circuit at region 142.

Emitter 136 of transistor T4 is formed within base region 130 and makes ohmic contact to $V_E$ bus 143. The output of T4 is taken from the collector at region 142 to a second level of metallization (not shown). As with the TTL circuit described previously, the output of this circuit runs orthogonally within a second level of metallization insulated from the first level to one of the conductive lines CH1...CHN. The collector output can thereby be connected to a cathode of another DTL circuit in the same or different column of the chip; or it may be connected to a driver circuit at the periphery of the array or off-substrate.

Taking the collector output of the circuit within the second level of metallization to one of the channels in the first level provides the same advantages as previously described with respect to the TTL circuit.

FIGS. 6, 7 and 7A illustrate an embodiment of our invention in the form of merged transistor logic (MTL), otherwise known as integrated injection logic (I²L). Merged transistor logic is the most recent bipolar family introduced in the industry. There have been numerous papers on this logic family in engineering publications, among them being the article by Berger and Wiedmann, entitled "Merged-Transistor Logic (MTL) — A Low-Cost Bipolar Logic Concept", IEEE Journal of Solid State Circuits, volume SC-7, No. 5, October 1972, pages 340–346.

FIG. 6 illustrates an MTL logic circuit which features Shottky Barrier clamping diodes associated with the MTL circuit. This circuit has been estimated to be five times faster than the speed of other MTL logic gates. The logic circuit in FIG. 6, in itself, forms no part of our invention. Its operation has already been described in the article entitled "Injection Logic's Range of Application is Widest", Electronics Magazine, July 10, 1975, pages 86–89. In view of this, little space will be devoted in this application to the operation of the circuit.

FIGS. 7 and 7A illustrate the layout of the Schottky-clamped MTL circuit in accordance with our invention. To completely illustrate the layout, both a plan and a cross-sectional view of a single such circuit within a semiconductor substrate is shown. Unlike the TTL and DTL circuits previously described, the MTL circuit features multiple outputs rather than multiple inputs. Thus, in the MTL embodiment, the Schottky Barrier diodes include an elongated active N type impurity region, conventionally termed the cathode, and a set of metallic contacts, conventionally termed anode, in the elongated region.

In addition, the MTL circuit includes a pair of transistors rather than one associated with the Schottky Barrier diodes. In FIG. 7 transistor T5 comprises a second device located adjacent the narrow side of first device, i.e., the Schottky Barrier diodes. Also, in accordance with the broad aspects of the invention, the number of other impurity regions, in this case the anodes of the Schottky Barrier diode, which are actually interconnected to the cathode region are always less than the predetermined maximum number of anode regions which may be so interconnected.

For a more specific description of the MTL layout, reference is now made to FIGS. 7 and 7A of the drawing. As previously noted, the MTL circuit includes a Schottky Barrier diode having multiple output regions 219 in non-ohmic contact with an elongated input region 229. In the device illustrated, each MTL circuit contains three such outputs which are interconnected through the first level of insulation 241 to conductive lines to denoted CH1, CH2, ... CH32. As shown in the drawing, only three such interconnections are made, with the other channels passing over the N− substrate, but not connected thereto. The cathode of the Schottky Barrier diode, which is N− substrate 229, is connected to N+ collector 232 of T5, which also comprises base region 231 and emitter region 230. The output of the emitter region is connected to a ground bus, denoted GND, which is disposed on the first level of insulation 241. Base region 231 of T5 is connected to the collector 220 of transistor T6 via conductive line 225. In this way, both base region 231 of transistor T5 and collector 220 of transistor T6 are connected to the input 218 of the circuit.

As illustrated in FIG. 7A, and also in common with the other preferred embodiments, input 218 is connected to an output of another MTL circuit on the chip via another conductor 245 disposed above and insulated from the first set of conductive lines by a second layer of electrically insulative material 240. Conductor 245 extends substantially parallel to the elongated direction of N− region 229. It is not necessarily connected to another MTL circuit in the same column, which is the connection shown in FIG. 7A. Alternatively, it may be connected to another circuit in a different column of the substrate or it may be connected to a driver circuit at the periphery of the array.

Transistor T6 also comprises an annular N type base region 224 surrounding P type emitter region 226. Base region 224 is also connected to ground contact 233 through N+ region 234. Ground line 233 is connected to the ground, GND, bus by metallization (not shown). Transistors T5 and T6 are isolated from one another by a dielectric isolation region 243 and an underlying P+ region in a conventional manner.

Although the circuit operation of the MTL family is considerably different from the TTL and DTL circuits previously described, the semiconductor layout can be fabricated in accordance with our invention to have the same fundamental characteristics. The density of the MTL circuits is very high because of the fundamental characteristics of an elongated impurity region and a set of other impurity regions formed within it, in this case the anodes and cathode of the Schottky Barrier diode. A second device, T5, is located adjacent the narrow side of cathode 229. A first set of first-level conductors extends over the elongated region 229 orthogonally with respect to the elongated direction. These are interconnected to selected ones of anode regions 219, the number always being less than the predetermined maximum number of the regions 219 available. Another conductor 245 in a second level of metallization is connected to base 231 region of T5 and extends substantially parallel to the elongated direction. Reference potential connections, in this case GND and +V are also made by conductive channels running in the same direction as the first set of conductors.

To summarize, we have provided an integrated circuit layout which assures the highest density of circuits presently available in the industry. The layout is adaptable to various types of circuits illustrated in the preferred embodiments. Obviously, various modifications of these circuits are also amenable to fabrication in this layout. In addition, the invention broadly encompasses other types of circuit families in which one region of a device, be it a transistor, diode or otherwise, may contain more than one impurity region of the same device.

While the invention has been particularly shown and described with reference to preferred embodiments thereof, it will be understood by those skilled in the art that the forgoing and other changes in form and details may be made therein without departing from the spirit and scope of the invention.

What is claimed is:

1. In the method of fabricating a semiconductor substrate layout which includes columnar arrays of circuits having substantially identical geometric form disposed within said substrate, the improvement wherein each of said circuits is formed by the steps of:
   forming a first device including an elongated impurity region and a set of other impurity regions formed within said elongated region and a second device located adjacent the narrow side of said first device;
   said elongated region being sufficiently large so as to be capable of containing a predetermined maximum number of said other impurity regions;
   forming selectively a first insulating layer above said substrate so as to expose both selected ones of said set of other impurity regions as well as an impurity region of said second device in said array;
   forming interconnecting means to the surface of said first insulating layer from said selected ones of said other impurity regions; the number of said other impurity regions so interconnected in each said circuit being less than said predetermined maximum number;
   forming a first set of conductors in each column extending over said elongated regions of said circuits orthogonally with respect to the elongated direction on said first insulating layer so as to connect certain ones of said set of conductors to said interconnected other impurity regions;
   forming a second insulating layer above said first insulating layer so as to expose said impurity regions of said second devices.
   forming a second set of conductors on said second insulating layer, thereby interconnecting said second set of conductors with said impurity regions of said second devices;
   said second set of conductors extending substantially parallel to said elongated direction.

2. A method as in claim 1 wherein:
   the number of impurity regions formed within said elongated region equals said predetermined number.

3. A method as in claim 1 wherein:
   all of the impurity regions formed within said elongated region are interconnected to said first set of conductors.

4. A method as in claim 1 further comprising the step of:
   forming, prior to the forming of said second insulating layer, a second set of reference-potential-supplying conductors extending orthogonally with respect to said elongated direction.

5. In the method of fabricating a semiconductor substrate layout which includes columnar arrays of TTL circuits having substantially identical geometic form disposed within said substrate, the improvement wherein:
   each of said circuits is formed by the steps of forming a first transistor including an elongated base region and a set of emitter regions in said elongated base region and a second transistor located adjacent the narrow side of said first transistor;
   said elongated base region being sufficiently large so as to be capable of containing a predetermined maximum number of said emitter regions;
   forming selectively a first insulating layer above said circuits so as to expose both selected ones of said set of emitter regions as well as the collector region of said second transistors;
   forming interconnecting means to the surface of said first insulating layer from said selected ones of said emitter regions;
   the number of said emitter regions so interconnected in each said TTL circuit being less than said predetermined maximum number;
   forming, on said first insulating layer, a first set of conductors in each said column extending over said elongated base regions and orthogonally with respect to the elongated direction so as to connect certain ones of said set of conductors to said interconnected emitter regions;
   forming a second insulating layer above said first insulating layer so as to expose said collector regions of said second transistors;
   forming a second set of conductors on said second insulating layer, thereby interconnecting said second set of conductors with said collector regions of said second transistors;
   said second set of conductors extending substantially parallel to said elongated direction.

6. A method as in claim 5 wherein:
   the number of emitter regions formed within said elongated base region equals said predetermined number.

7. A method as in claim 5 wherein:
   all of the emitter regions formed within said elongated base region are interconnected to said first set of conductors.

8. A method as in claim 5 further comprising the step of:
   forming, prior to the forming of said second insulating layer, a second set of reference-potential-supplying conductors extending orthogonally with respect to said elongated direction.

9. A method as in claim 8 further comprising the step of:
   forming, prior to the forming of said insulating layer, resistors within said substrate; said resistors being elongated substantially in the same direction as said elongated base region; and
   forming interconnecting means to the surface of said first insulating layer so as to connect said resistors between said reference-potential-supplying means and said transistors.

10. In the method of fabricating a semiconductor substrate layout which includes columnar arrays of DTL circuits having substantially identical geometric form disposed within said substrate, the improvement wherein:

each of said circuits is formed by the steps of forming a diode including an elongated impurity region and a set of other impurity regions in said elongated region and transistor located adjacent the narrow side of said diode;

said elongated region being sufficient large so as to be capable of containing a predetermined maximum number of said other impurity regions;

forming selectively a first insulating layer above said circuits so as to expose both selected ones of said set of other impurity regions as well as the collector region of said transistors;

forming interconnecting means to the surface of said insulating layer from said selected ones of said other impurity regions;

the number of said other impurity regions so interconnected in each said circuit being less than said predetermined maximum number;

forming, on said first insulating layer, a first set of conductors in each said column extending over said elongated regions of said circuits and orthogonally with respect to the elongated direction so as to connect certain ones of said set of conductors to said interconnected other impurity regions;

forming a second insulating layer above said first insulating layer so as to expose said collectors of said transistors;

forming a second set of conductors on said second insulating layer, thereby interconnecting said second set of conductors with said collectors of said transistors;

said second set of conductors extending substantially parallel to said elongated direction.

11. A method as in claim 10 wherein:
the number of impurity regions formed within said elongated region equals said predetermined number.

12. A method as in claim 10 wherein:
all of the impurity regions formed within said elongated region are interconnected to said first set of conductors.

13. A method as in claim 5 further comprising the step of:
forming, prior to the forming of said second insulating layer, a second set of reference-potential-supplying conductors extending orthogonally with respect to said elongated direction.

14. A method as in claim 13 further comprising the step of:
forming, prior to the forming of said first insulating layer, resistors within said substrate; said resistors being elongated substantially in the same directions as said elongated base region; and forming interconnecting means to surface of said first insulating layer so as to connect said resistors between said reference-potential-supplying means and said transistor.

15. In the method of fabricating a semiconductor substrate layout which includes columnar arrays of MTL circuits having substantially identical geometric form disposed within said substrate, the improvement wherein each of said circuits are formed by the steps of:

forming a Schottky Barrier diode including an elongated impurity region and a set of other impurity regions in said elongated region and a transistor located adjacent the narrow side of said first Schottky Barrier diode;

said elongated region being sufficiently large so as to be capable of containing a predetermined maximum number of said other impurity regions;

forming selectively a first insulating layer above said circuits so as to expose both selected ones of said set of other impurity regions as well as the base region of said transistors;

forming interconnecting means to the surface of said insulating layer from said selected ones of said other impurity regions;

the number of said impurity regions so interconnected in each said circuit being less than said predetermined maximum number;

forming, on said first insulating layer, a first set of conductors in each said column extending over said elongated regions of said circuits orthogonally with respect to the elongated direction so as to connect certain ones of said set of conductors to said interconnected other impurity regions;

forming a second insulating layer above said first insulating layer so as to expose said base regions of said transistors;

forming a second set of conductors on said second insulating layer, thereby interconnecting said second set of conductors with said base regions of said transistors;

said second set of conductors extending substantially parallel to said elongated direction.

16. A method as in claim 1 wherein:
all of the impurity regions formed within said elongated region are interconnected to said first set of conductors.

17. A method as in claim 15 further comprising the step of:
forming, prior to the forming of said second insulating layer, a second set of reference-potential-supplying conductors extending orthogonally with respect to said elongated direction.

* * * * *

UNITED STATES PATENT AND TRADEMARK OFFICE
CERTIFICATE OF CORRECTION

PATENT NO. : 4,080,720
DATED : March 28, 1978
INVENTOR(S) : J. Balyoz et al

It is certified that error appears in the above-identified patent and that said Letters Patent are hereby corrected as shown below:

Column 4, line 26: Delete "our" and substitute therefor --out--;

Column 12, line 5: Delete "geometic" and substitute therefor --geometric--;

Column 13, line 8: Delete "sufficient" and substitute therefor --sufficiently--.

Signed and Sealed this

Twenty-fourth Day of October 1978

[SEAL]

Attest:

RUTH C. MASON
*Attesting Officer*

DONALD W. BANNER
*Commissioner of Patents and Trademarks*